United States Patent
Noumi et al.

(10) Patent No.: US 9,564,456 B2
(45) Date of Patent: Feb. 7, 2017

(54) ARRAY SUBSTRATE AND DISPLAY DEVICE USING THE SAME

(71) Applicant: MITSUBISHI ELECTRIC CORPORATION, Tokyo (JP)

(72) Inventors: Shigeaki Noumi, Koshi (JP); Fumihiro Goto, Koshi (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/962,238

(22) Filed: Dec. 8, 2015

(65) Prior Publication Data

US 2016/0172385 A1 Jun. 16, 2016

(30) Foreign Application Priority Data

Dec. 12, 2014 (JP) ................. 2014-251584

(51) Int. Cl.
  *H01L 27/12* (2006.01)
  *G02F 1/133* (2006.01)
  *G02F 1/1362* (2006.01)
  *G02F 1/1343* (2006.01)

(52) U.S. Cl.
  CPC ........... *H01L 27/124* (2013.01); *G02F 1/1343* (2013.01); *G02F 1/136204* (2013.01); *G02F 1/136286* (2013.01); *H01L 27/1244* (2013.01)

(58) Field of Classification Search
  None
  See application file for complete search history.

(56) References Cited

U.S. PATENT DOCUMENTS

| | | | |
|---|---|---|---|
| 6,016,174 A | 1/2000 | Endo et al. | |
| 2002/0101547 A1* | 8/2002 | Lee | G02F 1/136204 349/40 |
| 2016/0070130 A1* | 3/2016 | Yuminami | G02F 1/13452 349/110 |

FOREIGN PATENT DOCUMENTS

| | | | |
|---|---|---|---|
| JP | H03-045934 A | 2/1991 | |
| JP | H10-268353 A | 10/1998 | |
| WO | WO-2014-174891 A1 * | 10/2014 | H01L 27/1244 |

* cited by examiner

*Primary Examiner* — Johannes P Mondt
(74) *Attorney, Agent, or Firm* — Studebaker & Brackett PC

(57) ABSTRACT

An array substrate includes: a gate wiring; a source wiring, which is formed to intersect the gate wiring; a passivation film, which covers the source wiring; and a pixel electrode that is formed on the passivation film. The array substrate has a display area and a dummy pixel area. In the display area, a switching element in the vicinity of the intersection of the gate wiring and the source wiring is provided. In the display area, the pixel electrode and the source wiring do not have an overlapping area in a top view. The dummy pixel area is located outside the display area, and in the dummy pixel area, a dummy pixel electrode and two source wirings, which are adjacent to the dummy pixel electrode have an overlapping area in a top view.

7 Claims, 7 Drawing Sheets

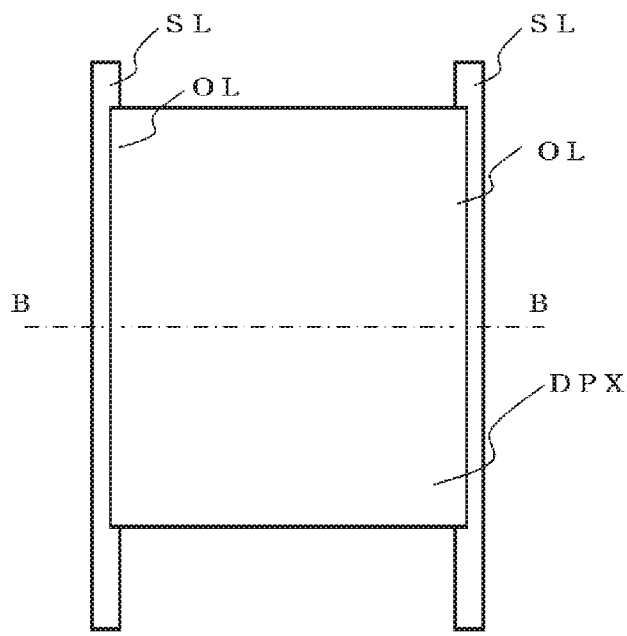
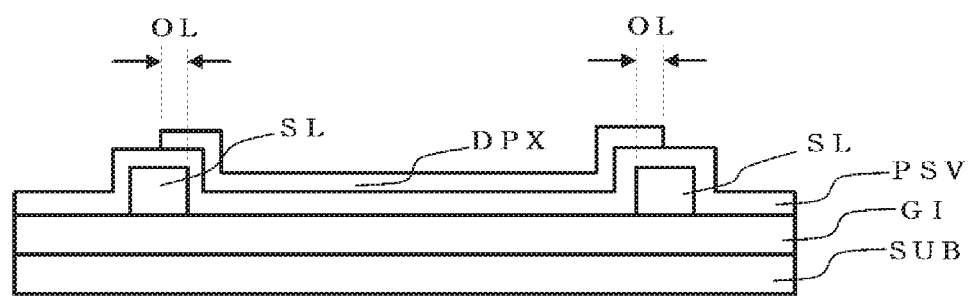

ARRAY SUBSTRATE AND DISPLAY DEVICE USING THE SAME

CROSS-REFERENCE TO RELATED APPLICATION

This application claims priority from Japanese Patent Application No. 2014-251584 filed on Dec. 12, 2014 the entire subject matter of which is incorporated herein by reference.

TECHNICAL FIELD

This disclosure relates to an array substrate and a display device, and more specifically, to an array substrate including thin-film transistors and pixel electrodes and a display device using the array substrate.

BACKGROUND

Recently, display devices have been used as information display for observers in various devices. Currently, instead of the cathode-ray tube which was the mainstream, new flat-panel display devices using liquid crystal, plasma, Electro-Luminescence (EL), Field Emission Display (FED), and the like have appeared. Particularly, a liquid crystal display device can be manufactured from a small-sized type to a large-sized type and is the representative flat-panel display device, in now.

Such a flat-panel display device is provided with a display area in which plural pixels are arranged in a matrix shape. In the display area, plural scanning lines and plural signals lines are formed and intersect each other to define pixels. In each pixel, a switching element having an electrode connected to the scanning line or the signal line and a pixel electrode connected to the switching element are formed. A voltage input from the signal line is applied to the pixel electrode via the switching element and is applied to an electro-optical medium such as a liquid crystal or an electroluminescence material to contribute to display. A thin-film transistor (TFT) is often used as the switching element.

When the TFT is formed, there may be a problem such as the pixels or the lines in the display area are damaged or dielectric breakdown of an insulating film is caused, due to static electricity during manufacturing. For the purpose of protecting the pixels in the display area from dielectric breakdown, dummy pixels are generally formed outside the display area (for example, see Japanese Unexamined Patent Application Publication No. Hei 03-045934).

A reversely-staggered type thin-film transistor which is subjected to back channel etching is generally used as a thin-film transistor for a liquid crystal display device. Further, an array structure, in which TFTs and pixel electrodes are separately formed with an insulating film interposed therebetween and the TFTs and the pixel electrodes are connected via contact holes formed in the insulating film, is often used. In making of such a structure, a method including forming an insulating film to cover formed TFTs, forming contact holes in the insulating film on the TFTs, forming pixel electrodes on the insulating film, and then connecting the TFTs and the pixel electrodes via contact holes is often used (for example, see Japanese Unexamined Patent Application Publication No. Hei 10-268353).

The main purpose of forming an insulating film on a TFT formed in a pixel is to protect the TFT from liquid crystal and to suppress an unnecessary electric field from being applied to the liquid crystal from the TFT. If there is a trouble in which a predetermined insulating film is not formed on a TFTs, a voltage is applied directly to the liquid crystal from the TFT. If such voltage application is continuously performed for a long time, the liquid crystal is charged or denatured, thereby finally causing display failure. However, since an application of a voltage for a long time is required until the display failure occurs and apparent display abnormality does not occur immediately after being turned on, there is a problem that it is difficult to find the trouble in inspection during manufacturing.

Further, when an insulating film is not formed, there is concern about a short circuit between the pixel electrode formed on the insulating film and the TFT, but the pixel electrode and the drain electrode of the TFT are originally connected to each other via a contact hole. Accordingly, if the pixel electrode overlaps only the drain electrode in a top view, the problems is not caused even when the insulating film therebetween is not formed.

On the other hand, when the pixel electrode is formed to overlap a signal line below the insulating film in a top view and the insulating film is not formed, the potential of the signal line is applied directly to the pixel electrode and thus abnormality can be immediately found as display failure. However, if the pixel electrode is formed in the above-mentioned way, capacitance is formed between the pixel electrode and the signal line, and thus there is a problem in that the supply of a signal voltage is delayed and does not follow an increase in the number of pixels accompanied with an increase in screen size.

Accordingly, the signal line is often formed so as not to overlap the pixel electrode. In this case, as described above, there remains a problem in that abnormality of display failure is not immediately found even when the insulating film is not formed. That is, since the application of a voltage for a long time is required up to display failure, there is a problem in that much time is required for inspection. Since the time required for the application of a voltage is greatly varied depending on array substrates, there is a possibility that the array substrates will shipped, as is.

SUMMARY

This disclosure is to provide an array substrate that can detect a failure through inspection even when the insulating film is not formed on a TFT and a display device using the array substrate.

An array substrate of this disclosure includes: a gate wiring; a source wiring, which is formed to intersect the gate wiring with a gate insulating film interposed therebetween; a passivation film, which covers the source wiring; and a pixel electrode that is formed on the passivation film, wherein the array substrate has a display area and a dummy pixel area, wherein in the display area, a switching element in the vicinity of the intersection of the gate wiring and the source wiring is provided, and a drain electrode of the switching element and the pixel electrode are electrically connected to each other via a contact hole which is opened in the passivation film, wherein in the display area, the pixel electrode and the source wiring do not have an overlapping area in a top view, wherein the dummy pixel area is located outside the display area, and wherein in the dummy pixel area, a dummy pixel electrode and two source wirings, which are adjacent to the dummy pixel electrode have an overlapping area in a top view.

When an insulating film is not formed on a TFT in an array substrate in which signal lines and pixel electrodes in a display area do not overlap each other, it is possible to detect a condition where the insulating film is not formed at the time of array inspection.

BRIEF DESCRIPTION OF THE DRAWINGS

The foregoing and additional features and characteristics of this disclosure will become more apparent from the following detailed descriptions considered with the reference to the accompanying drawings, wherein:

FIGS. 3A and 3B are diagrams illustrating a configuration example of a dummy pixel according to Embodiment 1;

DETAILED DESCRIPTION

Embodiment 1

Figure 1:
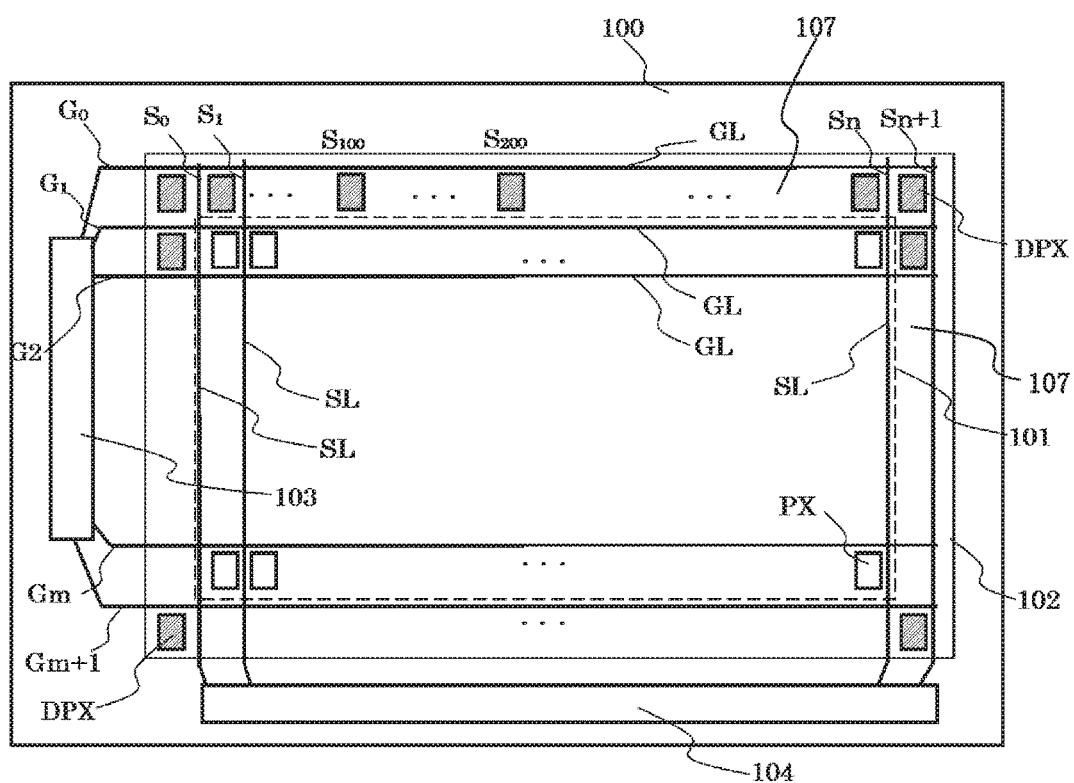
FIG. 1 is a diagram illustrating a configuration example of a display device according to Embodiment 1.

A plan view of an array substrate which is used in a display device according to Embodiment 1 is illustrated in FIG. 1. On an insulating substrate 100 formed of glass or the like, plural source wirings SL extending in the vertical direction in the drawing and plural gate wirings GL extending in the horizontal direction in the drawing are formed to perpendicularly intersect with each other. Pixel electrodes PX are respectively formed in areas which are defined by intersecting of the source wirings SL and the gate wirings GL with each other. In FIG. 1, only six pixel electrodes PX are illustrated for the purpose of simplification. However, m pixel electrodes in the direction of the gate wiring GL and n pixel electrodes in the direction of the source wiring SL are actually arranged in a matrix shape, so that total m×n pixel electrodes PX is formed.

Figure 2A:
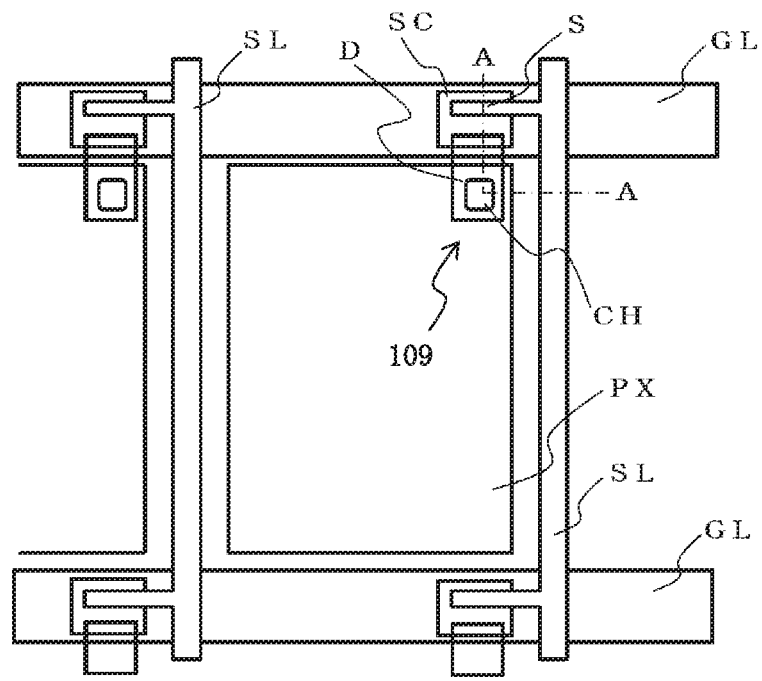
FIGS. 2A and 2B are diagrams illustrating a configuration example of a pixel according to Embodiment 1.
Figure 2B:
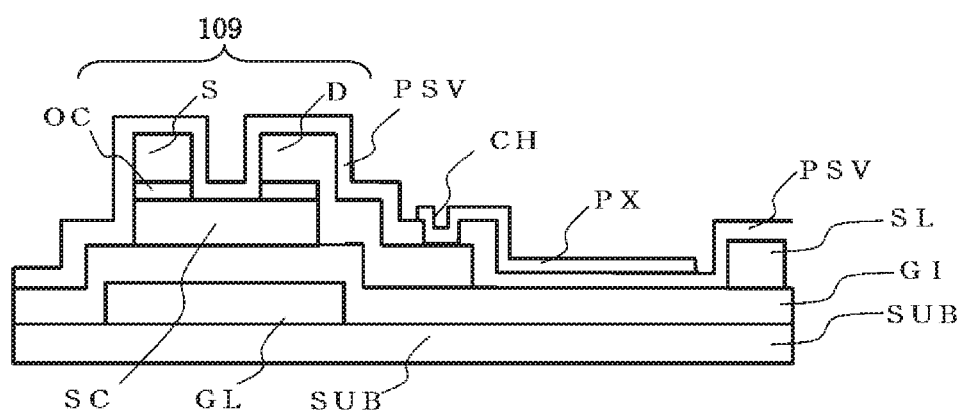

Although not illustrated in FIG. 1, switching elements such as thin-film transistors (TFT) 109 shown in FIGS. 2A-2B are formed in the vicinity of the intersections of the gate wirings GL and the source wirings SL. Although details will be described later, each TFT is connected to the corresponding pixel electrode PX. While each TFT is being turned on by receiving a scanning signal from the corresponding gate wiring GL, each TFT has a switching function of causing a data signal from the corresponding source wiring SL to transmit to the corresponding pixel electrode PX. The gate wirings GL are connected to a gate drive circuit 103 and the source wirings SL are connected to a source drive circuit 104.

In FIG. 1, an area surrounded with a dotted line refers to a display area 101, and the pixel electrodes PX are arranged in a matrix shape in the area as described above. On the other hand, an area surrounded with a solid line refers to a pixel area 102, and dummy pixel electrodes DPX in addition to the pixel electrodes PX are arranged in the area 102, whereas only dummy pixel electrodes DPX are formed in a dummy pixel area 107.

A relationship between the pixel electrodes PX and the dummy pixel electrodes DPX will be described below. In forming the TFTs, a problem in that the pixel electrodes PX or the wirings SL and GL in the display area 101 are damaged or dielectric breakdown of an insulating film to be described later is caused may occur due to static electricity generated during the manufacturing process and introduced into the array substrate.

Therefore, for the purpose of protecting the pixel electrodes PX and the like in the display area 101 from the above-mentioned breakdown, the dummy pixel area 107 in which dummy pixel electrodes DPX are arranged is generally formed outside the display area 101.

The pixel electrodes PX in the display area 101 contribute to display of the display device, but the dummy pixel electrodes DPX do not contribute to display of the display device and is shielded from light. In FIG. 1, the pixel area 102 corresponds to an area in which the pixel electrodes PX and the dummy pixel electrodes DPX are arranged in a matrix shape, but only the dummy pixel electrodes DPX are arranged in the dummy pixel area 107 inside the pixel area 102 and outside the display area 101.

In FIG. 1, the plural gate wirings GL are numbered in $G_0$, $G_1$, ..., $G_m$, and $G_{m+1}$ in the direction in which the gate wirings GL are arranged, the dummy pixel electrodes DPX are arranged between the gate wiring GL of the $G_0$-th row and the gate wiring GL of the $G_1$-th row, and these dummy pixel electrodes DPX are connected to the gate wiring GL of the $G_0$-th row. Similarly, the dummy pixel electrodes DPX are arranged outside the gate wiring GL of the $G_{m+1}$-th row and these dummy pixel electrodes DPX are connected to the gate wiring GL of the $G_{m+1}$-th row.

The plural source wirings SL are numbered in $S_0$, $S_1$, ..., $S_n$, and $S_{n+1}$ in the direction in which the source wirings SL are arranged, the dummy pixel electrodes DPX are arranged outside the source wiring SL of the $S_0$-th column, and these dummy pixel electrodes DPX are connected to the source wiring SL of the $S_0$-th column. Similarly, the dummy pixel electrodes DPX are arranged between the source wiring SL of the $S_n$-th column and the source wiring SL of the $S_{n+1}$-th column and these dummy pixel electrodes DPX are connected to the source wiring SL of the $S_{n+1}$-th column.

The gate wirings GL other than the $G_0$-th row or the $G_{m+1}$-th row are connected to the dummy pixel electrodes DPX connected to the source wirings SL of the $S_0$-th column or the $S_{n+1}$-th column, and also connected to the pixel electrodes PX connected to the source wirings SL of the $S_1$-th column to the $S_n$-th column. The source wirings SL other than the $S_0$-th column or the $S_{n+1}$-th column has similar configuration.

The pixel electrode or the dummy pixel electrode connected to the gate wiring GL of the $G_i$-th row and the source wiring SL of the $S_j$-th column is referred to as $G_iS_j$. The dummy pixel electrodes DPX in FIG. 1 are $G_0S_0$ to $G_0S_{n+1}$, $G_{m+1}S_0$ to $G_{m+1}S_{n+1}$, $G_0S_0$ to $G_{m+1}S_0$, and $G_0S_{n+1}$ to $G_{m+1}S_{n+1}$ as described above. That is, in FIG. 1, the dummy pixel electrodes DPX are arranged to surround the outermost of the pixel area 102.

The difference in shape between the pixel electrode PX and the dummy pixel electrode DPX will be described in more detail below. First, the pixel electrode PX will be described. FIG. 2A is a plan view of a pixel electrode PX in the display area 101 and the vicinity thereof, and FIG. 2B is a cross-sectional view taken along line A-A in FIG. 2A.

In FIGS. 2A and 2B, a gate electrode and gate wiring GL is formed on a glass substrate SUB, and a gate insulating film GI is formed to cover the gate electrode and gate wiring GL. A semiconductor film SC formed of silicon or the like is formed on the gate insulating film GI. The semiconductor film may be an amorphous film or a crystalline film, or may be formed of oxide semiconductor such as In—Ga—Zn—O instead of silicon.

A source electrode S and a drain electrode D are formed on the semiconductor film SC so as to face each other on the semiconductor film SC with an ohmic contact film OC interposed therebetween. The source electrode S is formed integrally with the source wiring SL or is electrically connected to the source wiring SL. A protective insulating film PSV is formed to cover a switching element as a thin-film transistor (TFT) 109 including the elements formed on the glass substrate SUB. A pixel electrode PX is formed on the protective insulating film PSV.

The pixel electrode PX is electrically connected to the drain electrode D of the thin-film transistor TFT via a contact hole CH opened in the protective insulating film PSV. On the other hand, the pixel electrode PX and the source wiring SL do not overlap each other in a top view. This is to suppress an increase in capacitance of the source wiring SL or a delay of a source signal due to the overlapping of the pixel electrode PX and the source wiring SL from adversely affecting display as described above.

In the configuration illustrated in FIGS. 2A and 2B, even when a trouble that the protective insulating film PSV is not formed occurs, the pixel electrode PX and the thin-film transistor TFT are connected to each other via the drain electrode D. On the other hand, the pixel electrode PX does not short-circuit with the source wiring SL. Accordingly, even when display inspection for a short time is performed, it is difficult to detect a condition where the protective insulating film PSV is not formed.

The configuration in the vicinity of a dummy pixel electrode DPX will be described below with reference to FIGS. 3A and 3B. FIG. 3A is a plan view illustrating a dummy pixel electrode DPX formed outside the display area 101 and the vicinity thereof, and FIG. 3B is a cross-sectional view taken along line B-B in FIG. 3A.

The plan view of FIG. 3A and the cross-sectional view of FIG. 3B correspond to FIGS. 2A and 2B, respectively. FIGS. 3A and 3B are different from FIGS. 2A and 2B, in that the dummy pixel electrode DPX is formed to have a shape larger than the pixel electrode PX so that an area OL overlaps the source wiring SL. That is, the dummy pixel electrode DPX overlaps one source wiring SL at an end of the dummy pixel electrode DPX with the protective insulating film PSV interposed therebetween in a top view. In other words, the dummy pixel electrode DPX has areas OL overlapping two adjacent source wirings SL at both end portions in a top view. Here, the end portion refers to a pattern end portion of the dummy pixel electrode DPX on the side on which the dummy pixel electrode DPX and the source wiring SL face each other. In FIGS. 3A and 3B, the end corresponds to a side of the dummy pixel electrode DPX on the side facing the source wiring SL.

In the configuration illustrated in FIGS. 3A and 3B, when there is a trouble that the protective insulating film PSV is not formed, the dummy pixel electrode DPX and the thin-film transistor are connected to each other via the drain electrode D, but the dummy pixel electrode DPX short-circuits with the source wiring SL in the overlapping area OL. Accordingly, the adjacent source wirings SL are electrically connected to each other via the dummy pixel electrode DPX. As a result, for example, in the inspection step of the manufacturing process, it is possible to detect the trouble as a short-circuit defect (SS short-circuit) between the source wirings SL.

Additionally, when the dummy pixel electrode DPX and the source wiring SL overlap each other, a problem with a signal delay accompanied with an increase in source wiring capacitance would occur as described above with reference to the pixel electrode PX, but the influence on the display is negligibly small when the overlapping area is present in only the dummy pixel. In FIGS. 3A and 3B, both sides of the dummy pixel electrode DPX overlap the source wirings SL, but only a part of both ends of the dummy pixel electrode DPX may overlap the source wirings SL. In this case, the signal delay is further improved.

In FIGS. 3A and 3B, in order to facilitate understanding the difference between the dummy pixel electrode DPX and the pixel electrode PX, a thin-film transistor is not described, but a thin-film transistor may be formed. Specifically, in the same way as illustrated in FIGS. 2A and 2B, a thin-film transistor may be formed in the vicinity of the dummy pixel electrode DPX or in the vicinity of the intersection of the source wiring SL and the gate wiring GL. However, even when a thin-film transistor is not formed in the dummy pixel electrode DPX, the advantages of Embodiment 1 can be obtained as long as both end portions of the dummy pixel electrode DPX overlap the source wirings SL.

Accordingly, in the array substrate according to Embodiment 1, it is possible to detect a condition where a protective insulating film is not formed by normal inspection while suppressing a negative influence of the source wiring capacitance on the display to the minimum.

Embodiment 2

Figure 4:
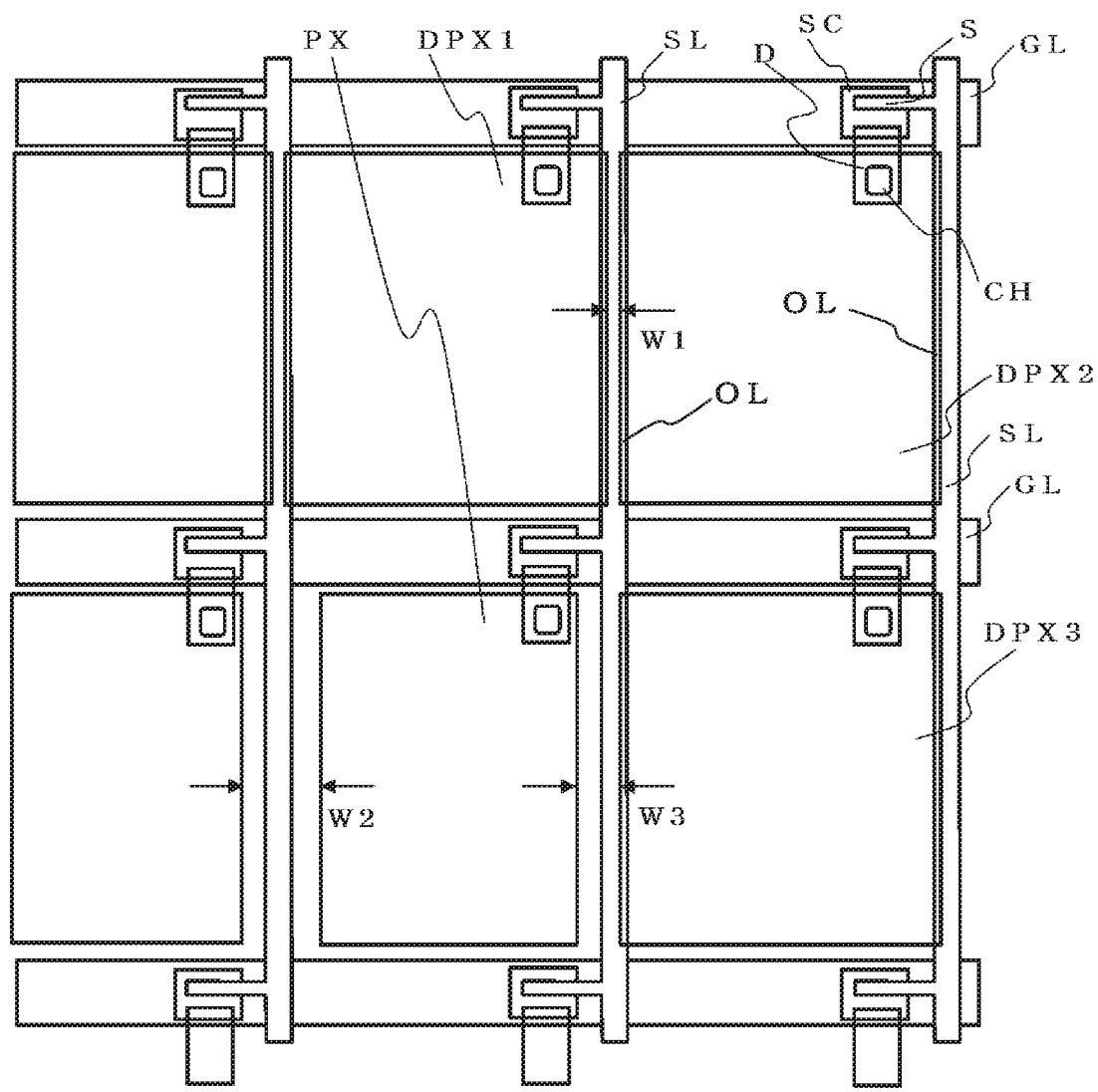
FIG. 4 is a diagram illustrating a configuration example of the display device according to Embodiment 1.

Before Embodiment 2 is described, a plan view of dummy pixel electrodes DPX and pixel electrodes PX is illustrated in FIG. 4. This is a plan view of a region corresponding to four pixels $G_0S_n$, $G_0S_{n+1}$, $G_1S_n$, and $G_1S_{n+1}$ illustrated in FIG. 1. Specifically, the dummy pixel electrode DPX1 corresponds to G0Sn, the dummy pixel electrode DPX2 corresponds to $G_0S_{n+1}$, and the dummy pixel electrode DPX3 corresponds to $G_1S_{n+1}$. The pixel electrode PX corresponds to $G_1S_n$. As described with reference to FIGS. 3A and 3B, the dummy pixel electrodes DPX1, DPX2, and DPX3 in FIG. 4 have areas OL overlapping two adjacent source wirings SL. The pixel electrode PX does not have an area overlapping the source wiring SL.

In FIG. 4, since the dummy pixel electrode DPX1 or DPX2 has areas OL overlapping two adjacent source wirings SL, the distance W1 between the dummy pixel electrodes is smaller than the distance W2 between the adjacent pixel electrodes PX. Since the dummy pixel electrode DPX3 has areas OL overlapping two adjacent source wirings SL, the distance W3 between the dummy pixel electrode DPX3 and the adjacent pixel electrode PX is smaller than the distance W2 between the adjacent pixel electrodes PX. Accordingly, the possibility that the dummy pixel electrodes will short-circuit or the dummy pixel electrode DPX3 and the pixel electrode PX will short-circuit on the source wiring SL due to a pattern defect or the like is higher than the possibility that the pixel electrodes PX in the display area 101 will short-circuit on the source wiring SL.

When such a short circuit occurs and the dummy pixel electrodes short-circuit, the capacitance of the source wiring SL below the short-circuited place increases to cause a problem with a signal delay. When the dummy pixel electrode DPX and the pixel electrode PX short-circuit, the short-circuited pixel electrode PX serves as a point defect and causes a display defect. Accordingly, there is a problem in that the manufacturing yield decreases and the manufacturing cost increases.

Figure 5:
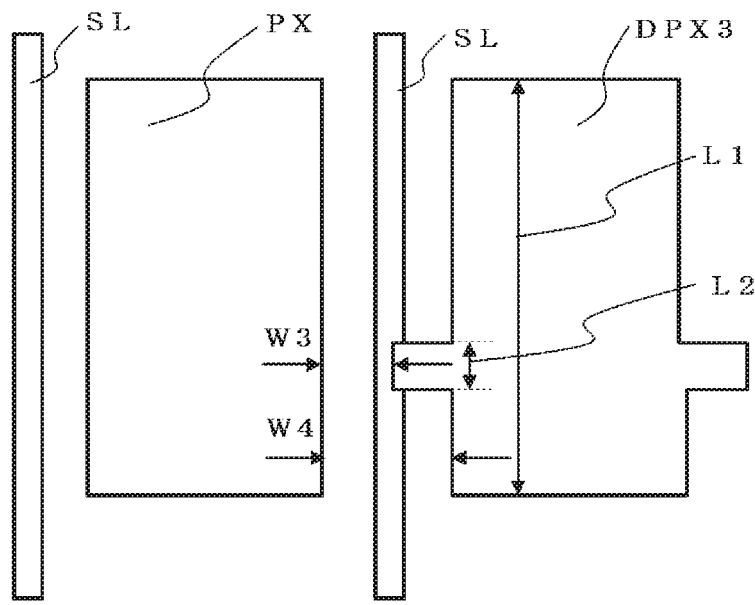
FIG. 5 is a diagram illustrating a configuration example of a dummy pixel according to Embodiment 2.

A configuration example of a dummy pixel electrode and a pixel electrode according to Embodiment 2 is illustrated in FIG. 5. In Embodiment 2, an area in which the dummy pixel electrode DPX and the source wiring SL overlap does not correspond to a whole of a pixel length L1, but a part L2 of pixel length L1.

As described above, in the area in which the distance between the dummy pixel electrode and the pixel electrode is only W3, a short circuit between the pixel electrodes is likely to occur, and the possibility of a short circuit increases as the area having the distance W3 becomes longer. In FIGS. 3A and 3B, the area having the distance W3 is formed over the whole of the pixel length which is the length of the dummy pixel electrode in the direction parallel to the source wiring. In other words, the distance between the dummy pixel electrode and the pixel electrode is W3 at any position. Accordingly, there is a possibility a short circuit between the dummy pixel electrode and the pixel electrode on the source wiring.

However, in Embodiment 2, the area in which the distance between the dummy pixel electrode and the pixel electrode is W3 is formed only in the range of L2 in FIG. 5. In other words, the area in which the dummy pixel electrode DPX and the source wiring SL overlap each other is shorter than the pixel length of the dummy pixel electrode. On the other hand, in an area other than L2, the distance between the dummy pixel electrode and the pixel electrode is W4 which is larger than the distance W3. Accordingly, since the area having the distance W3 does not correspond to the pixel length L1 but corresponds to a part L2 thereof, it is possible to reduce the possibility of a short circuit between the dummy pixel electrode DPX and the adjacent pixel electrode PX.

Although not illustrated, since the same advantage is obtained between the dummy pixel electrodes and the area with the distance W1 does not correspond to the pixel length L1 but corresponds to a part L2 thereof, it is possible to reduce the possibility of a short circuit between the adjacent dummy pixel electrodes DPX.

By employing this pattern arrangement, it is possible to obtain the advantages of Embodiment 1 that, if the pixel pattern and the source wiring are short-circuited in a case where the protective insulating film PSV is not formed, a short-circuit (SS) can be detected in the inspection step of the manufacturing process, and it is also possible to suppress the problem such as a short-circuit between the dummy pixels or a short-circuit between the pixel electrode and the dummy pixel electrode.

Embodiment 3

Figure 6:
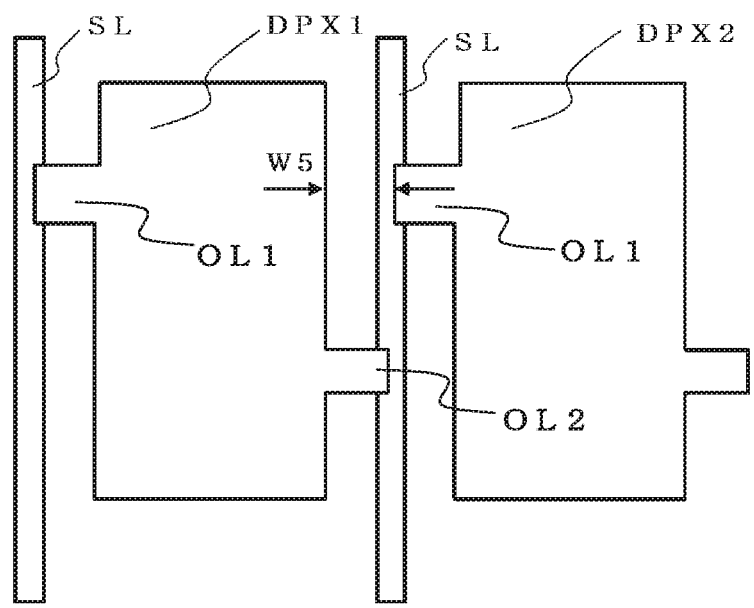
FIG. 6 is a diagram illustrating a configuration example of a dummy pixel according to Embodiment 3.

A configuration example of a dummy pixel electrode according to Embodiment 3 is illustrated in FIG. 6. In Embodiment 3, a first area OL1, in which a source wiring SL overlaps a dummy pixel electrode DPX1, and a second area OL2, in which the same source wiring SL where the first area OL1 is formed overlaps a dummy pixel electrode DPX2, do not face each other on the source wiring SL. More specifically, the first area OL1 and the second area OL2 do not face each other in the width direction of the source wiring SL.

In other words, the area, in which the dummy pixel electrode DPX1 and the source wiring SL overlap, and the area, in which the dummy pixel electrode DPX2 and the source wiring S overlap, are set to positions which are different side by side. Specifically, the distances from the lower side of the pixel pattern to the areas overlapping the source wiring are different side by side and are set to distances without overlapping.

In the embodiment illustrated in FIG. 6, the distance W5 between the dummy pixel electrode DPX1 and the adjacent dummy pixel electrode DPX2 is larger than the distance W1 between the dummy pixel electrode DPX1 and the adjacent dummy pixel electrode DPX2 in FIG. 4. Accordingly, it is possible to reduce the possibility of a short circuit between the dummy pixel electrodes on the source wiring.

By employing this pattern arrangement, it is possible to obtain the advantages of Embodiment 1 that if the pixel pattern and the source wiring short-circuit in a case where the protective insulating film PSV is not formed, a short-circuit (SS) can be detected in the inspection step of the manufacturing process, and it is also possible to suppress the problem such as a short-circuit between the dummy pixels or a short-circuit between the pixel electrode and the dummy pixel electrode.

Embodiment 4

Figure 8:
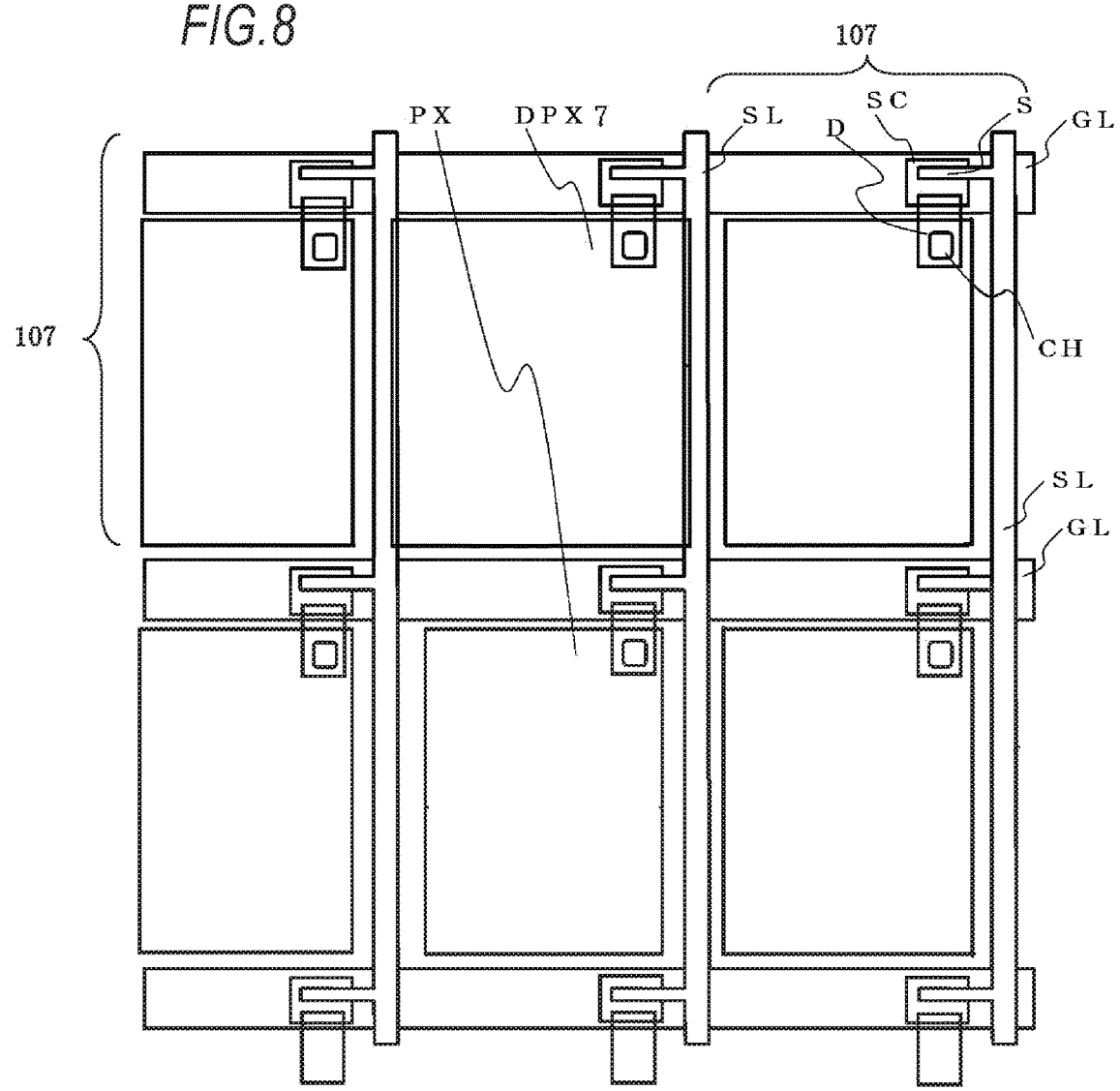
FIG. 8 is a diagram illustrating a configuration example of a display device according to Embodiment 4.

In Embodiments 1 to 3, when the dummy pixel electrodes DPX are formed to have the same structure from $G_0S_0$ to $G_0S_{n+1}$ and a trouble that the protective insulating film PSV is not formed occurs, all the source wirings SL short-circuit as an electrically-unified body via the dummy pixel electrodes DPX. In this case, a condition where the protective insulating film is not formed can be detected by normal inspection. However, the dummy pixel electrodes DPX do not need to be formed from $G_0S_0$ to $G_0S_{n+1}$. As shown in FIG. 8, by setting only a predetermined dummy pixel DPX7 to have the configuration according to Embodiments 1 to 3 and inspecting only the dummy pixel, it is possible to detect a condition where the protective insulating film is not formed.

In Embodiment 4, the patterns of the dummy pixel electrodes according to Embodiments 1 to 3 are formed in only the predetermined dummy pixel instead of all the dummy pixels. In other words, a dummy pixel in which the dummy pixel electrode does not overlap the source wiring is present in the dummy pixel area.

As described above, the pixels in the display area 101 in FIG. 1 are pixels $(G_1, S_1)$ to $(G_m, S_n)$ and the pixels outside the display area 101 are dummy pixels. That is, the $G_0$-th row, the $G_{m+1}$-th row, the $S_0$-th column, and $S_{n+1}$-th column include dummy pixels. Here, for example, in the $G_0$-th row, only the dummy pixels at intervals of 100 pixels such as $G_0S_{100}$, $G_0S_{200}$, $G_0S_{300}$, . . . can be set to have the dummy pixel electrode patterns according to Embodiments 1 to 3. The interval is not limited to 100 pixels, and at least one predetermined dummy pixel can exhibit the advantages of this disclosure.

By performing inspection after positions at which the dummy pixel electrode according to this disclosure will be formed are determined in advance, a short circuit (SS) occurs in only the determined positions when the passivation film is not formed. Accordingly, it is possible to rapidly and accurately determine a defect that the passivation film is not formed.

Embodiment 5

In Embodiments 1 to 4, an overlapping portion is formed in the dummy pixel electrode DPX and the source wiring SL by changing the shape of the dummy pixel electrode DPX to a shape different from that of the pixel electrode. However, in Embodiment 5, the same advantages are obtained without changing the shape of the dummy pixel electrode DPX.

Figure 7:
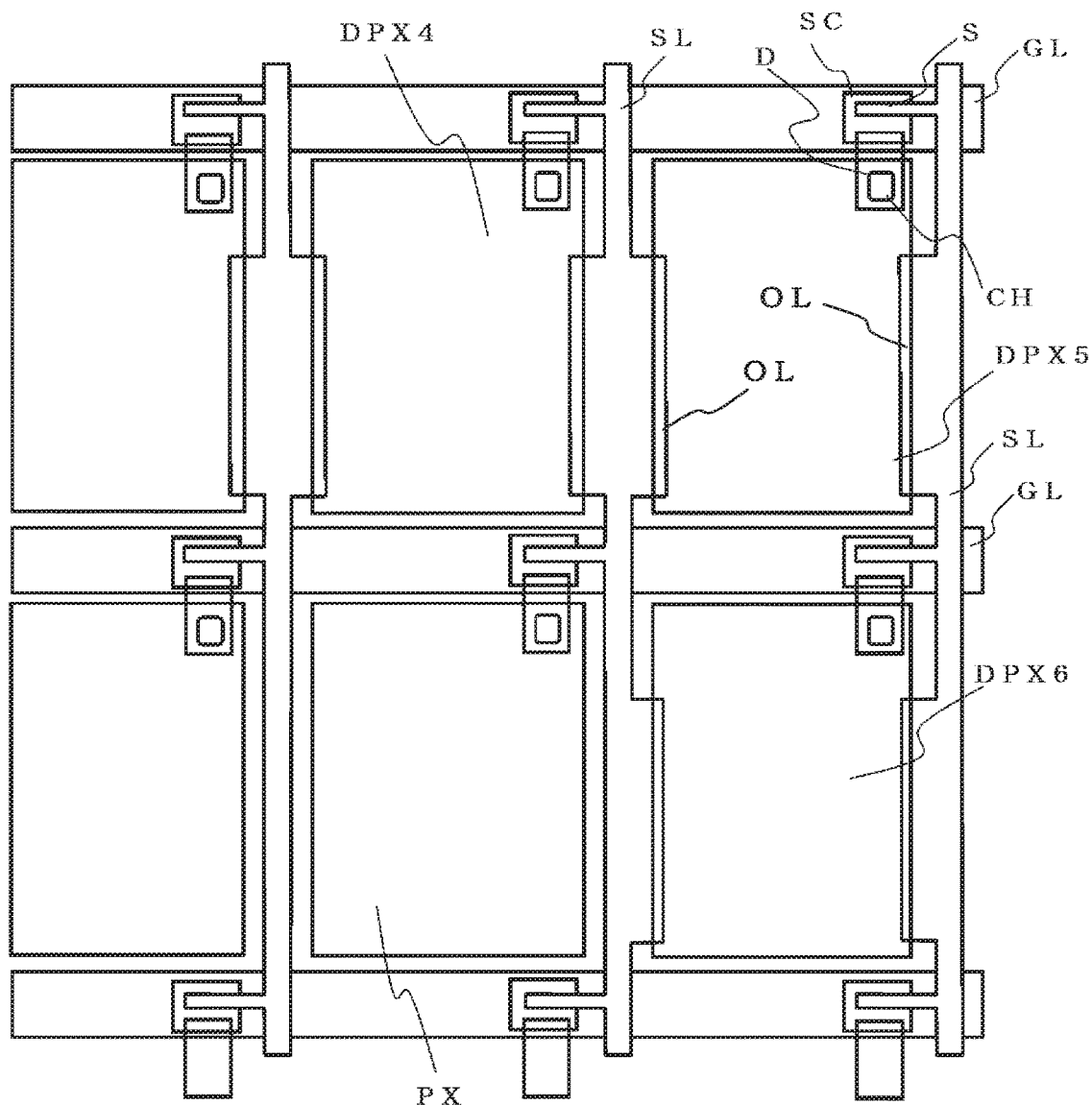
FIG. 7 is a diagram illustrating a configuration example of a display device according to Embodiment 5.

A plan view of dummy pixel electrodes DPX and pixel electrodes PX according to Embodiment 5 is illustrated in FIG. 7. FIG. 7 is a plan view of positions corresponding to four pixels $G_0S_n$, $G_0S_{n+1}$, $G_1S_n$, and $G_1S_{n+1}$ illustrated in FIG. 1. Specifically, the dummy pixel electrode DPX4 corresponds to $G_0S_n$, the dummy pixel electrode DPX5 corresponds to $G_0S_{n+1}$, and the dummy pixel electrode DPX6 corresponds to $G_1S_{n+1}$. The pixel electrode PX corresponds to $G_1S_n$. As described with reference to FIGS. 2A and 2B, the pixel electrode PX does not have an area overlapping the source wiring SL.

On the other hand, the dummy pixel electrodes DPX4, DPX5, and DPX6 have areas OL overlapping two adjacent source wirings SL. However, unlike Embodiments 1 to 4, the shape of the dummy pixel electrodes DPX has substantially the same shape as the pixel electrode PX. Instead, the width of the source wiring SL in the overlapping areas OL is larger than the width of areas other than the overlapping areas OL. That is, as can be clearly seen from FIG. 7, the areas OL in which a dummy pixel electrode DPX and two adjacent source wirings SL overlap each other is formed by setting the width of the source wirings SL on both sides of the dummy pixel to be larger in Embodiment 5.

In FIG. 7, the dummy pixel electrode DPX and the pixel electrode PX have the same shape, but this embodiment is not limited to this configuration. The gist of Embodiment 5 includes an increase in the width of the source wiring in order to form the overlapping portions OL, as well as changing of the shape of the dummy pixel electrode. The overlapping portions may be formed by appropriately optimizing both the shape of a dummy pixel electrode DPX and the width of a source wiring. The shape of a dummy pixel electrode may be changed in a part in the pixel area, and the width of a source wiring may be increased in the other part.

In FIG. 7, the dummy pixel electrodes DPX and the pixel electrodes PX have the same shape. However, in this case, since the dummy pixel electrodes DPX and the pixel electrodes PX have the same shape as the pixel electrode, it is possible to suppress a defect that the distance between a dummy pixel and an adjacent pixel electrode is small and to suppress the short-circuit. The advantages of Embodiment 1 can be obtained. That is, when the protective insulating film PSV is not formed, the pattern of the dummy pixel electrode DPX and the source wiring SL short-circuit in the overlapping portions OL, and it is thus possible to detect a short circuit (SS) in the inspection step of an array substrate.

In FIG. 7, the overlapping area OL is formed to avoid the vicinity of the thin-film transistor. In Embodiment 5, the overlapping area OL is formed by increasing the width of the source wiring, and this embodiment can be applied to all the dummy pixels. However, when the drain electrode D of the thin-film transistor is close to the source wiring SL, the possibility that short-circuit and a defect occur due to a pattern defect or the like increases. In FIG. 7, since the drain electrode D and the overlapping area OL are separated from each other, the possibility of a short circuit becomes low.

Embodiment 6

When it is assumed that the source wiring SL of the dummy pixel is formed in the large width from G0S0 to G0Sn+1 in the configuration of FIG. 7 and a trouble that the protective insulating film PSV is not formed occurs, all of the source wirings SL are short-circuited as an electrically-unified body via the dummy pixel electrodes DPX. In this case, a condition where the protective insulating film is not formed can be detected by normal inspection. However, the source wirings SL of the dummy pixels do not need to be increased in width from $G_0S_0$ to $G_0S_{n+1}$. By setting only a predetermined dummy pixel to have the configuration according to Embodiment 5 and inspecting only the dummy pixel, it is possible to detect a condition where a protective insulating film is not formed.

It is possible to manufacture a display device by a known method using the array substrates according to Embodiments 1 to 6. For example, a liquid crystal display device can be manufactured by: bonding the array substrate and a counter substrate with interposing liquid crystal therebetween; sealing the periphery of the substrates; connecting an external circuit to terminals of the array substrate or the counter substrate; and installing a light source in the back thereof. An electroluminescence type display device can be manufactured by: forming a light-emitting layer that emits light by applying an electric field to pixel electrodes of the array substrate; covering the light-emitting layer with an insulating film; and forming a common electrode. It is also possible to manufacture an electrophoresis type display device that drives microcapsules including white and black pigment particles by an electric field generated by the array substrate and an external circuit or an electronic liquid powder type display. Although not a display device, an image sensor for visible light, ultraviolet light, or radiation can also be manufactured by forming photoelectric conversion elements instead of pixel electrodes in the array substrate according to this disclosure.

What is claimed is:

1. An array substrate comprising:
   gate wirings;
   source wirings, which are formed to intersect the gate wirings with a gate insulating film interposed therebetween;
   a passivation film, which covers the source wirings; and
   a pixel electrode that is formed on the passivation film,
   wherein the array substrate has a display area and a dummy pixel area,
   wherein in the display area, a switching element in the vicinity of the intersection of the gate wirings and the source wirings is provided, and a drain electrode of the switching element and the pixel electrode are electrically connected to each other via a contact hole which is opened in the passivation film,
   wherein in the display area, the pixel electrode and the source wirings do not have an overlapping area in a top view,
   wherein the dummy pixel area is located outside the display area, and
   wherein in the dummy pixel area a first dummy pixel electrode has a first overlapping area with a first one of the source wirings and a second overlapping area with a second one of the source wirings in a top view, both said first one and said second one of the source wirings being adjacent to the dummy pixel electrode.

2. The array substrate according to claim 1,
   wherein the first dummy pixel electrode is formed to be larger than the pixel electrode.

3. The array substrate according to claim 1,
   wherein a length of overlap of an overlapping area of the first and second overlapping areas is shorter than a pixel length of the dummy pixel electrode.

4. The array substrate according to claim 3,
wherein a first area in which the first dummy pixel electrode and one of the two source wirings overlap and a second area in which a second dummy pixel electrode adjacent to the first dummy pixel electrode and the same one of the two source wirings overlap are disposed on the same one of the two source wirings, and wherein the first area and the second area do not face each other on the same one of the two source wirings in a width direction of the source wirings.

5. The array substrate according to claim 1,
wherein a width of part of one of the two source wirings in the overlapping area is larger than a width thereof in an area other than the overlapping area.

6. The array substrate according to claim 1,
wherein the dummy pixel area includes another dummy pixel wherein in a dummy pixel electrode of the another dummy pixel does not overlap the source wiring.

7. A display device comprising
the array substrate according to claim 1.

* * * * *